US006217393B1

(12) United States Patent
Muta

(10) Patent No.: US 6,217,393 B1
(45) Date of Patent: Apr. 17, 2001

(54) APPLIANCE CONNECTOR AND PRODUCTION METHOD THEREOF

(75) Inventor: Junji Muta, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/333,975

(22) Filed: Jun. 16, 1999

(30) Foreign Application Priority Data

Jun. 17, 1998 (JP) ........................................ 10-169883

(51) Int. Cl.[7] ........................ H01R 13/405; H05K 3/00

(52) U.S. Cl. ........................ 439/736; 29/884; 29/883; 29/876

(58) Field of Search ........................ 439/736, 607, 439/492–499, 497, 608–610, 660, 722; 29/884, 883, 876

(56) References Cited

U.S. PATENT DOCUMENTS

| | | |
|---|---|---|
| 3,391,456 | 7/1968 | Gannoe . |
| 4,602,830 | 7/1986 | Lockard . |
| 4,639,056 | 1/1987 | Lindeman et al. . |
| 5,201,662 | 4/1993 | Roche . |
| 5,267,875 | 12/1993 | Koegel et al. . |

*Primary Examiner*—Paula Bradley
*Assistant Examiner*—Antoine Ngandjui
(74) *Attorney, Agent, or Firm*—Banner & Witcoff, Ltd.

(57) ABSTRACT

A connector has multiple layers of rows of tabs provided on one side of a housing, and contact members extending from each tab aligned in a single plane on the other side.

Carriers 17A and 17B of upper and lower bus bars 12 and 13 are positioned one above the other, position fixing holes 20 thereof being aligned. Rows of tabs 15A and 15B provided above and below on one side and are separated by a prescribed distance. Contact members 18A and 18B are aligned at the other side in a plane, the contact members 18A being interspersed within the contact members 18B. This insert is placed in a forming die and a moulded housing is produced by insert moulding, both carriers 17A and 17B being cut off and removed thereafter to render the contact members 18A, 18B electrically independent.

12 Claims, 7 Drawing Sheets

APPLIANCE CONNECTOR AND PRODUCTION METHOD THEREOF

TECHNICAL FIELD

The present invention relates to an appliance connector and the production method thereof.

BACKGROUND TO THE INVENTION

A prior multipole appliance connector, one end of which is attached to a printed circuit board prior to use, has a plurality of terminals installed in a connector housing; these terminals are aligned in rows in order to save space, etc., and these rows are distributed in multiple layers on the side of the connector fitting with a corresponding connector. Contact members extend from each terminal on the side of the connector attached to the printed wiring board. These contact members need to be aligned in a single plane so as to be attached by wire bonding with contact points aligned on the edge of the printed circuit board.

Conventionally, when this type of appliance connector is produced, each terminal is formed individually in a shape such that one end can be positioned in the multiple layers and the contact points of the other end can be positioned in a single plane. The housing in which attachment holes for these terminals are aligned is formed separately. Each terminal is attached by being press-fitted into a corresponding attachment hole, with the tab protruding.

However, this conventional production method is extremely cumbersome, particularly as the multipolarity of connectors is increasing, and an improved production method is required.

The present invention has been developed after taking the above problem into consideration and aims to present an appliance connector with a simplified production, and the production method thereof.

SUMMARY OF THE INVENTION

According to the invention there is provided an insert-moulded electrical connector having a housing, a first row of spaced terminals each having a respective contact member in a single plane, and a second row of spaced terminals interspersed within said first row and each having a respective contact member in said single plane, said rows of terminals being fixed and located as said housing is moulded thereabout.

Such a construction avoids the need for individual location of each terminal in a separately moulded housing.

The terminals may be in two or more mutually parallel planes, but what is important is that the contact members thereof are uni-planar for connection to the edge of a printed circuit board.

The connector may further include a position fixing member for the terminals, each terminal being located in a respective aperture of the position fixing member. This position fixing member may also be insert-moulded into the housing.

The invention also provides a method of manufacturing an electrical connector having on one side a row of terminals in a single plane, and another side two or more rows of terminals in spaced planes, the method comprising the steps of:

a) forming a first row of spaced terminals in a common plane, the terminals having a common first row carrier, b) forming a second row of spaced terminals in a common plane, the terminals having a common second row carrier in a plane parallel to the plane of said second row, c) placing said carriers one above the other such that said first and second row of terminals are interspersed adjacent said carriers, d) forming a plastics housing to fix and locate said terminals by insert moulding; and e) shearing said carriers from said first and second rows of terminals, thereby rendering each of said terminals electrically independent whilst being fixed in said housing.

The method may include the preliminary step of forming mutually alignable apertures in the common carriers, and aligning those apertures in the mould with mould alignment pins. Such an arrangement ensures precise location and positioning prior to insert moulding.

BRIEF DESCRIPTION OF DRAWINGS

Other features of the invention are disclosed in the following description of a preferred embodiment shown by way of example only in the accompanying drawings, in which.

DESCRIPTION OF PREFERRED EMBODIMENT

Figure 1:
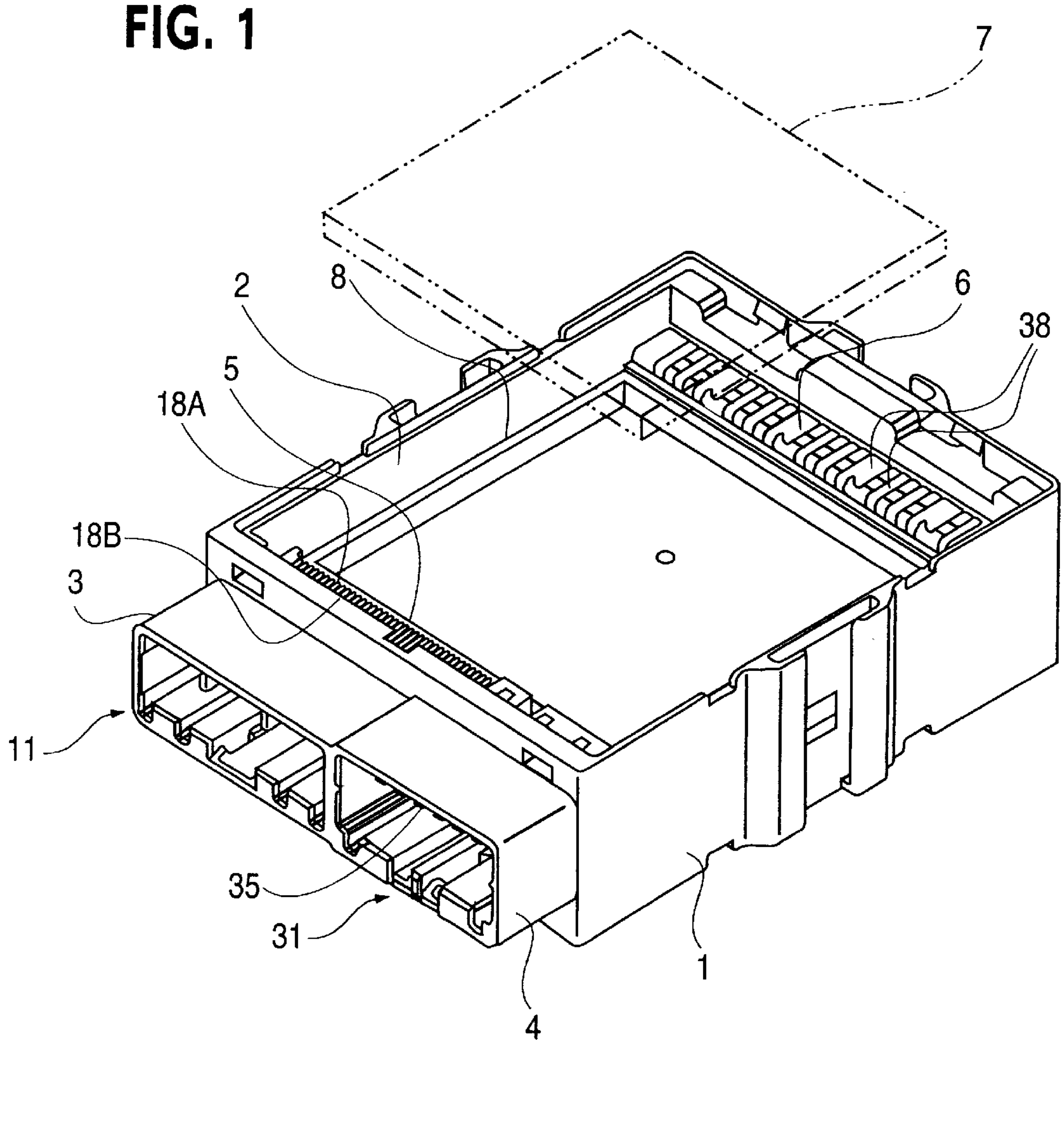
FIG. 1 is a diagonal view of a control box of an embodiment of the present invention.

An embodiment of the present invention is explained below with the aid of FIGS. 1 to 9. This embodiment illustrates a connector suitable for use in a control box of an automobile.

First, the overall configuration of the control box will be explained with reference to FIG. 1. A main body 1 of the control box is made from plastic by moulding, and an upper face thereof forms a square box shape in which a recess 2 is provided. Two hoods 3 and 4 are formed side by side in a unified manner on a side face of the main body 1, this side being the left anterior side face in FIG. 1. Rows of terminals 15A and 15B (explained in detail later) are provided as upper and lower layers within the hood 3 located on the far side, this forming a first connector member 11. In the same manner, rows of terminals 35 are provided as upper and lower layers within the hood 4, this forming a second connector member 31. Rows of contact members 5 and 6 are formed within the recess 2 of the upper face, the row of contact members 5 being on the side wall directly behind the connector members 11 and 31, and the row of contact members 6 being on the opposite side wall. A supporting frame 8 is formed between the rows of contact members 5 and 6, this supporting a printed circuit board 7.

Contact members 18A and 18B are horizontally aligned within the row of contact members 5 located at the closer side, these contact members 18A and 18B extending from tabs or coupling members 16A and 16B of the first connector member 11. Contact members 38 are horizontally aligned within the row of contact members 6 located at the farther side, these contact members 38 extending from tabs of the second connector member 31. After the board 7 has been fitted into the supporting frame 8, contact points provided on the sides of the board 7 make contact with the corresponding contact members 18A and 18B or the contact members 38, and are fixed by wire bonding.

Next, the production sequence is explained, with the focus on the first connector member 11.

Figure 2:
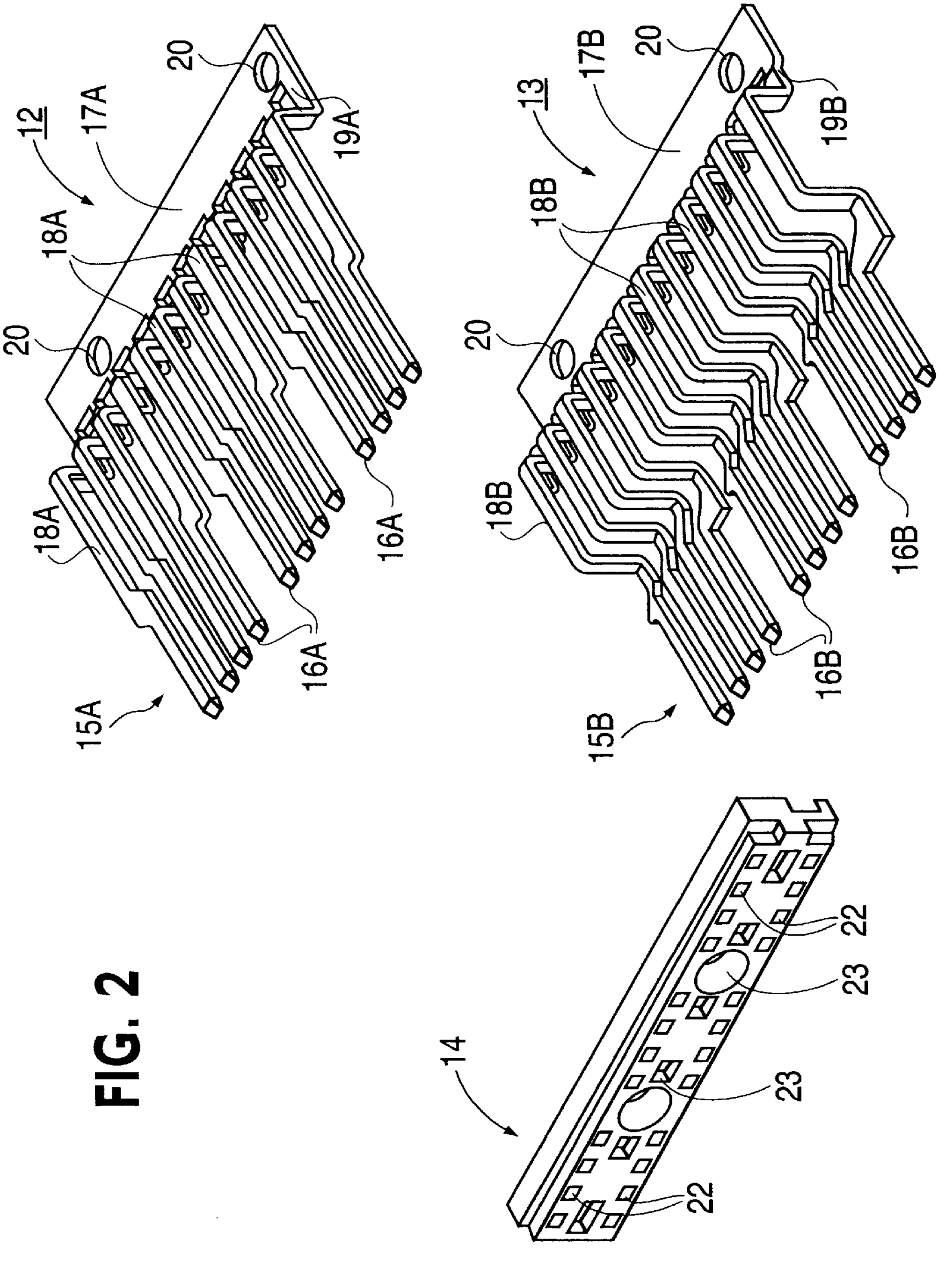
FIG. 2 is a disassembled diagonal view of an insert for connector housing.

As FIG. 2 shows, the first connector member 11 is provided with an upper bus bar 12, a lower bus bar 13, and a position fixing plate 14.

The upper bus bar 12 is formed by press forming an electrically conductive metal sheet, and the twelve pictured tabs 16A which comprise the upper row of terminals 15A are connected in a unified manner by a carrier 17A. The twelve tabs 16A are divided into three groups each comprising four tabs, the tabs 16A within each group being horizontally aligned with a prescribed distance between each tab, and with a wider distance separating the groups from one another.

The contact members 18A extend from the posterior of each tab 16A. The contact members 18A, after being formed sideways to the extent required, extend in a posterior direction and are consequently horizontally aligned in a manner whereby the space between each adjoining contact member 18A is greater than the space which separates the contact members 18B (to be described later) of the lower bus bar 13. One end of each contact member 18A is formed again at right-angles so as to protrude in a downwards and posterior direction, and is connected to the carrier 17A by a connecting member 19A. position fixing holes 20 are formed on both ends of the carrier 17A.

The lower bus bar 13 is also formed by press forming an electrically conductive metal sheet, and the twelve pictured tabs 16B which comprise the lower row of terminals 15B are connected in a unified manner by a carrier 17B. The twelve tabs 16B are also divided into three groups each comprising four tabs, the tabs 16B within each group being horizontally aligned with a prescribed distance between each tab, and with a wider distance separating the groups from one another. As will be explained below, when the upper and lower bus bars 12 and 13 are placed together, the upper and lower rows of terminals 15A and 15B mutually correspond and are separated by a prescribed distance.

The contact members 18B extend from the posterior of each tab 16B. When the upper and lower rows of terminals 15A and 15B are positioned so as to mutually correspond while being separated by a prescribed distance, these contact members 18B are horizontally aligned and fit between the contact members 18A of the upper bus bar 12. For this purpose, the contact members 18B are formed sideways from the posterior end portion of each tab 16B to the extent required, these then being raised to a height equivalent to that of the corresponding space between the upper and lower rows of terminals 15A and 15B, and For this purpose, a forming die is provided such as that in FIG. 4. This forming die comprises, for example: a fixed lower mould 41; an upper mould 42 above the lower mould 41 and capable of being moved up and down; and a moveable mould 43 located to the left of the lower mould 41 and the upper mould 42 and capable of being moved to the left and right. A moulding cavity 44 for moulding the housing 26 is formed on the joining faces of the three moulds 41, 42 and 43. Fitting holes 45 are formed on the joining face of the moveable mould 43, the upper and lower tabs 16A and 16B fitting therein. Further, pins 46, pins 47, and pins 48 protrude upwards from the upper face of the lower mould 41. The pins 46 fit with the position fixing holes 20 of the carriers 17A and 17B, the pins 47 support the lower faces of the contact members 18A and 18B, and the pins 48 protrude upwards so as to extend along the posterior of the upwards-rising portion of the contact members 18B of the lower bus bar 13.

Figure 4:
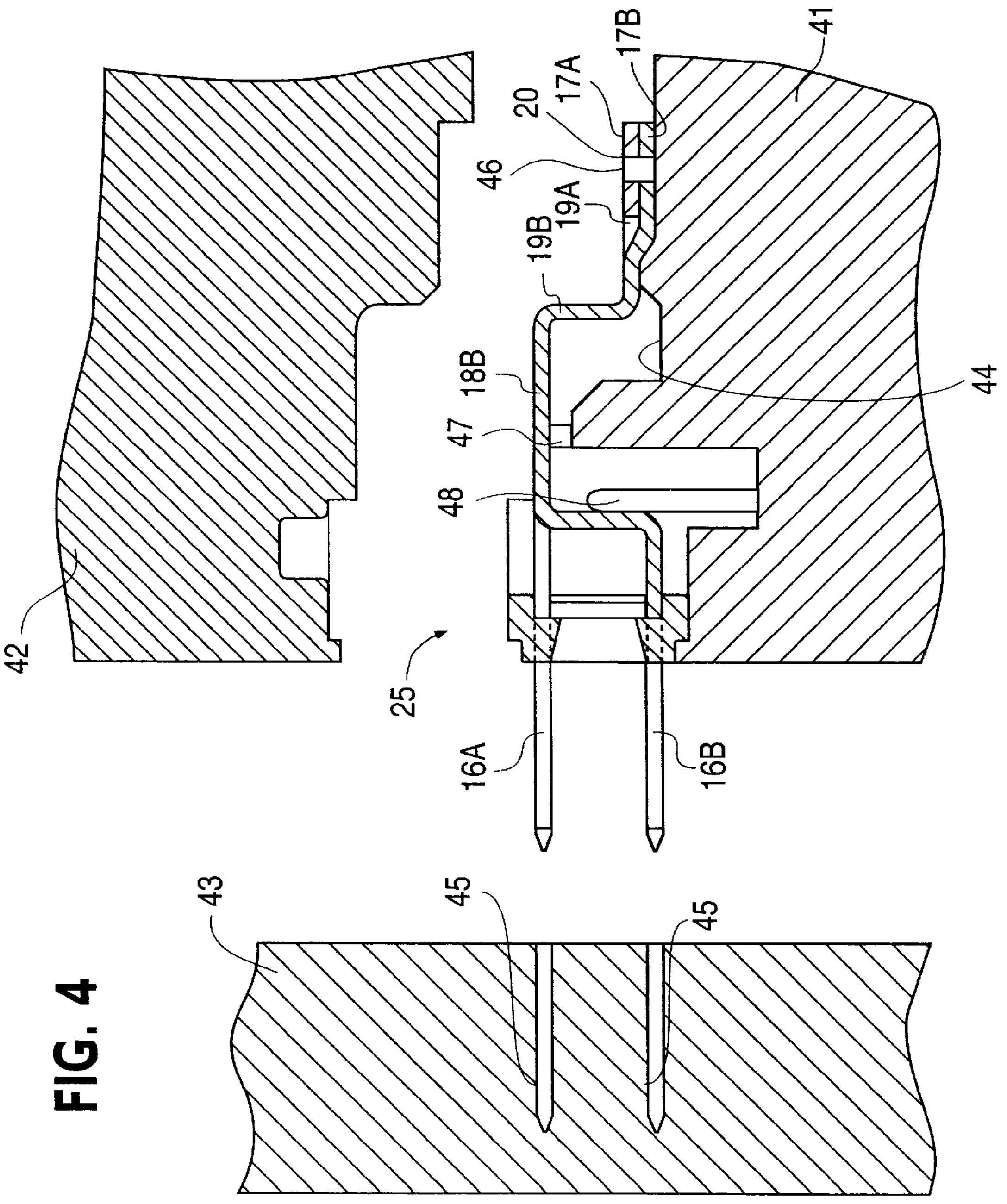
FIG. 4 is a cross-sectional view of a forming die of the connector housing, the die being in an open state.
Figure 5:
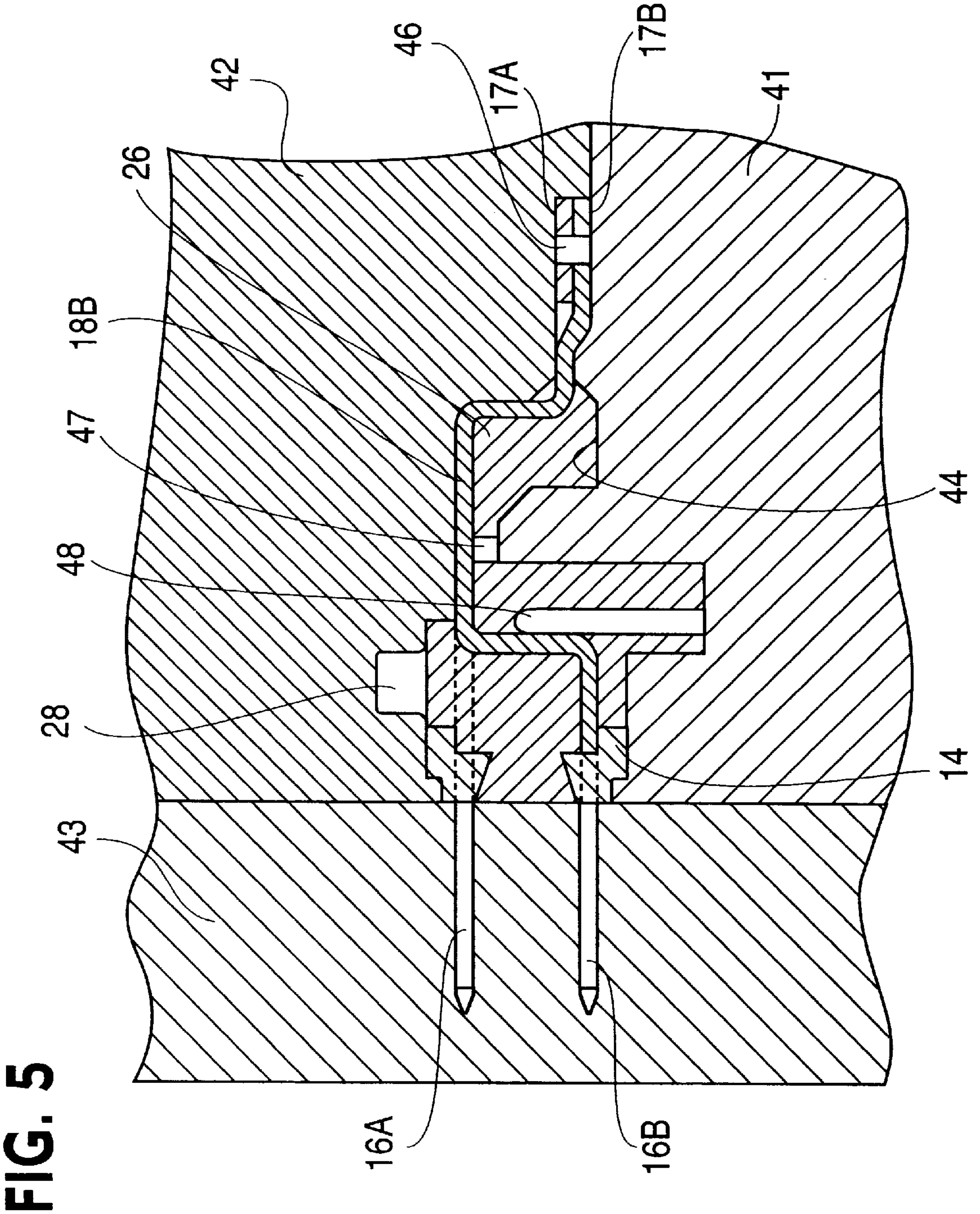
FIG. 5 is a cross-sectional view of the die in a closed state.

In order to mould the first moulded member 27, the forming die is positioned in an open state as shown in FIG. 4, and the insert 25 is positioned on the upper face of the lower mould 41, with the position fixing holes 20 of the carriers 17A and 17B being fitted onto the pins 46, the lower faces of the contact members 18A and 18B making contact with the pins 47, and the posterior faces of the rising portion of the contact members 18B extending along the pins 48. Next, the tabs 16A and 16B are fitted into the fitting holes 45, the moveable mould 43 is moved in a rightwards direction relative to FIG. 4, and the upper mould 42 is lowered. The forming die is thereby closed and the moulding cavity 44 is formed between the joining faces of the moulds 41, 42 and 43.

Figure 6:
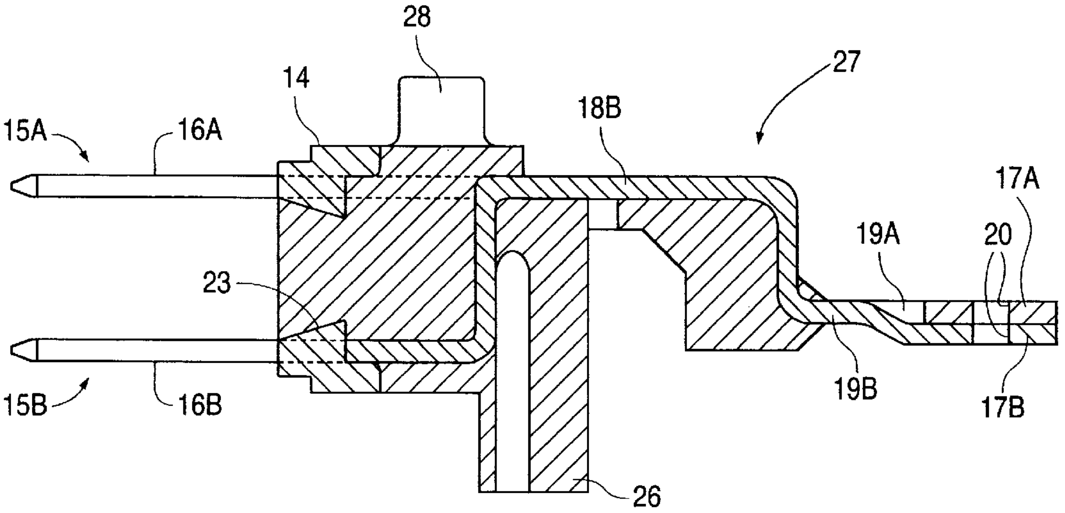
FIG. 6 is a cross-sectional view of the moulded housing.
Figure 8:
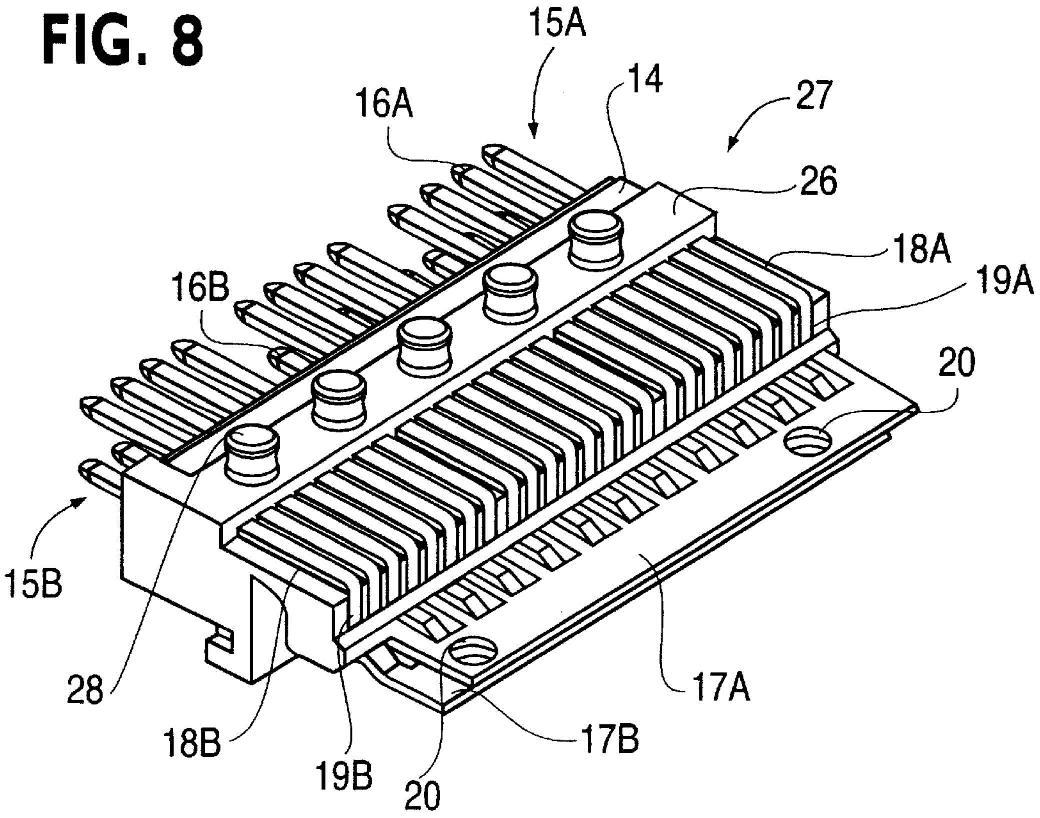
FIG. 8 is a diagonal view of the moulded housing.

From this state, molten plastic such as ABS resin etc., is injected into the moulding cavity 44 through a gate (not shown), the forming die is opened after the plastic has hardened and, as shown in FIGS. 6 and 8, the first moulded member 27 with the housing 26 being moulded around the insert 25 is removed. The housing 26 surrounds the base of the upper and lower rows of terminals 15A and 15B and supports the lower side faces of the contact members 18A and 18B which are aligned horizontally. At this juncture, the plastic has entered the window holes 23 of the plate 14, thereby unifying the housing 26 and the plate 14. Moreover, a plurality of bosses 28 protrude from the upper face of the portion of the housing 26 surrounding the base of the rows of terminals 15A and 15B, these bosses 28 being used for binding when secondary moulding (to be explained later) is performed. then being made to extend in a posterior direction. The extending end of each contact member 18B is formed twice at right-angles so as to extend in a downwards and posterior direction, and is connected to the carrier 17B by a connecting member 19B. As shown in FIG. 4, the carrier 17B is stepped downwards, the size of this step corresponding to the thickness of the carrier 17B. Position fixing holes 20 are formed on both ends of the carrier 17B, the location of these corresponding to that of the position fixing holes 20 in the carrier 17A of the upper bus bar 12.

The carriers 17A and 17B of the upper and lower bus bars 12 and 13 are positioned one above the other with the position fixing holes 20 being together, the upper and lower rows of terminals 15A and 15B correspond with each other, separated by a prescribed distance, and the contact members 18A or 18B are aligned along a plane by mutually fitting together. A position fixing plate 14 is made from a plastic such as PBT resin or ABS resin, and the upper and lower rows of terminals 15A and 15B of the upper and lower bus bars 12 and 13 are inserted therethrough. Insertion holes 22 are aligned on the plate 14 to allow the upper and lower tabs 16A and 16B to be inserted. Moreover, window holes 23 pass through the plastic at prescribed locations between the insertion holes 22.

Figure 3:
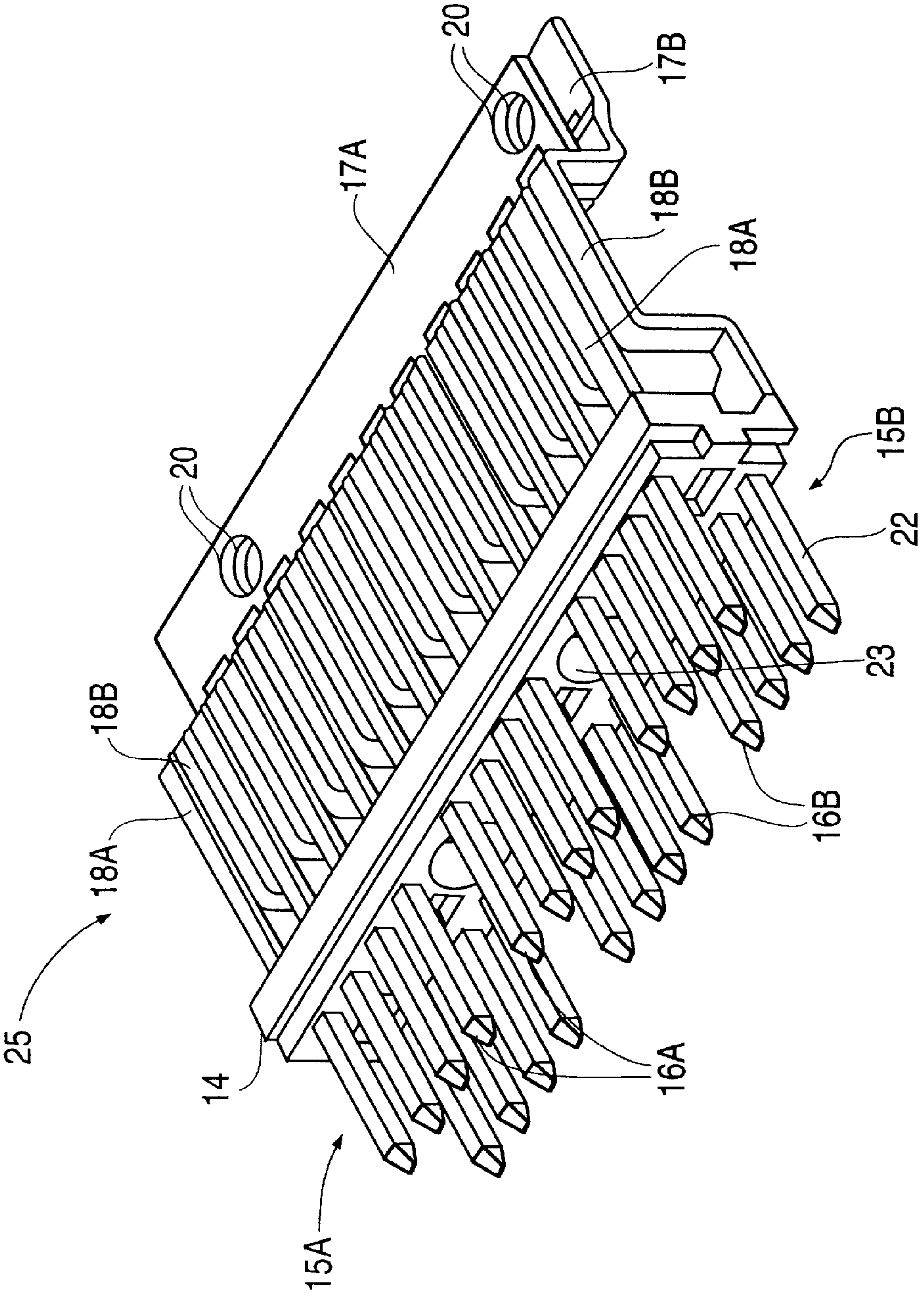
FIG. 3 is a diagonal view of the assembled insert.

The upper and lower bus bars 12 and 13 are positioned one above the other by aligning the carriers 17A and 17B as described above, and then the tabs 16A and 16B are inserted through the corresponding insertion holes 22 of the plate 14 as far as the base of the upper and lower rows of terminals 15A and 15B. As a result, as shown in FIG. 3, the upper and lower bus bars 12 and 13 are joined together in a unified manner by the plate 14 and form an insert 25. This insert 25 comprises the upper and lower rows of terminals 15A and 15B corresponding to each other and separated by a prescribed distance, and the contact members 18A and 18B aligned along a plane. Furthermore, the position fixing holes 20 of the upper and lower carriers 17A and 17B match together.

Next, a first moulded member 27 is formed in which a housing 26 is moulded around the insert 25.

Figure 7:
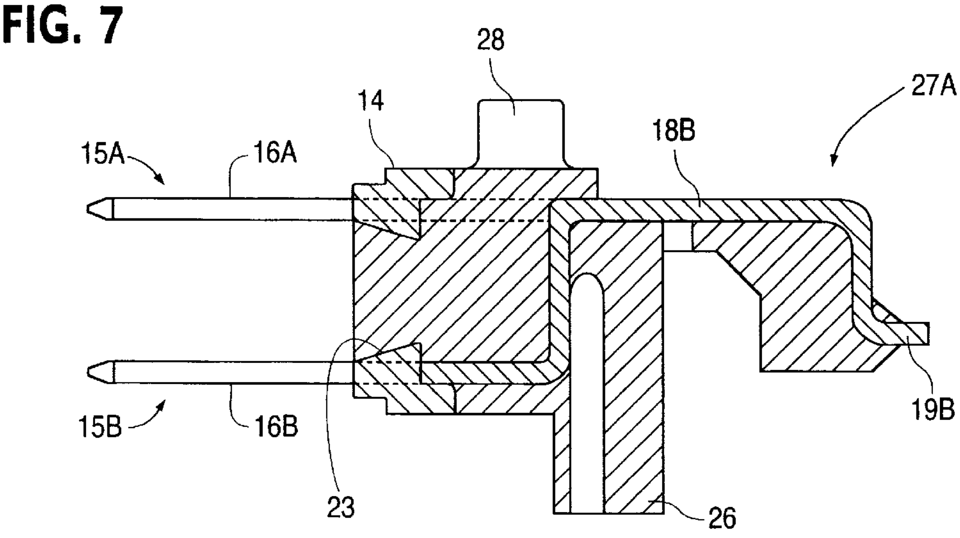
FIG. 7 is a cross-sectional view of the moulded housing after carriers have been cut off.
Figure 9:
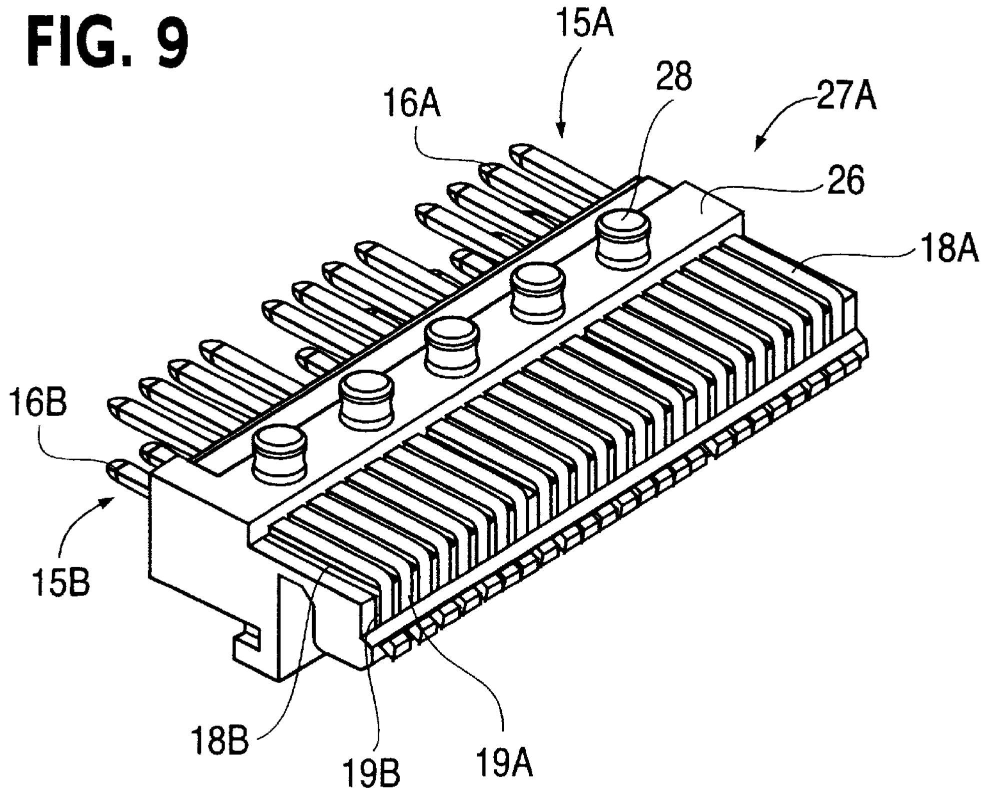
FIG. 9 is a diagonal view of the moulded housing after the carriers have been cut off.

After the first moulded member 27 has been formed in the manner described above, the carriers 17A and 17B of the two bus bars 12 and 13 are cut off and removed. Specifically, this cutting off occurs on a portion slightly behind the lower edge of the descending portion of the connecting members 19A and 19B, these connecting members 19A and 19B connecting the contact members 18A and 18B to the carriers 17A and 17B. The portions extending behind the connecting members 19A and 19B are aligned along an identical face, and consequently the carriers 17A and 17B can be cut off by supporting this portion in the mould and press shearing a single time. FIGS. 7 and 9 show the first moulded member 27 after the carriers 17A and 17B have been cut off.

The second connector member 31, which will be explained in less detail, is prepared by providing two rows of tabs 35 as upper and lower layers. Horizontally aligned contact members 38 protruding from the tabs are grouped together to form an insert, a housing surrounding the insert is formed within a first moulded member, and carriers are cut off in the same manner as above.

The first moulded members of the first connector member 11 and the second connector member 31, the carriers of both having been cut off, are joined together in a unified manner in a prescribed position, this forming another insert which is secondary moulded to form the main body 1 of the control box shown in FIG. 1.

According to the embodiment explained above, a simplification of the production process results from using insert moulding to form a connector (first moulded member 27) whereby the terminals 15A and 15B are provided in two layers on one side of the housing 26 so as to form the insert 25 during the moulding of the main body 1 of the control box, and the other side of the housing 26 has contact members 18A and 18B aligned along a face.

The upper and lower bus bars 12 and 13 comprising the first moulded member 27 are formed in a unified manner and joined by the carriers 17A and 17B respectively, these carriers 17A and 17B being cut off and removed after the first moulded member 27 has been moulded. As a result, handling is convenient during the production process, such as when the bus bars 12 and 13 are joined together, etc. Further, these are joined together with the portions of the carriers 17A and 17B to be cut off being one above the other and, consequently, the carriers 17A and 17B can be cut off by shearing a single time. In this manner, in order to facilitate cutting, the carriers 17A and 17B are one above the other prior to being cut off, and the upper and lower bus bars 12 and 13 are in a contacting state. However, the upper and lower bus bars 12 and 13 are in a non-contacting state after the carriers 17A and 17B are cut off.

The position fixing holes 20 are provided on both carriers 17A and 17B, these matching together when the carries 17A and 17B are joined together. The pins 46 in the moulding cavity 44 of the forming die fit into these position fixing holes 20, and the position of the carriers 17A and 17B within the moulding cavity 44 is thereby easily fixed.

Furthermore, after the bus bars 12 and 13 are joined together, the plate 14 is fitted onto the base of the upper and lower rows of terminals 15A and 15B, thereby preventing the tabs 16A and 16B from shifting position whole, for example, receiving pressure from the resin during moulding. The position of the tabs 16A and 16B is thereby reliably maintained during production.

The present invention is not limited to the embodiments described above with the aid of figures. For example, the possibilities described below also lie within the technical range of the present invention. In addition, the present invention may be embodied in various other ways without deviating from the scope thereof.

(1) The rows of tabs may also be provided as three or more layers.

(2) The present invention is not limited to the production of the moulded housing described in the above embodiment. It is equally suitable for the production of a single connector in which rows of tabs are provided in multiple layers on one side of a housing, and contact members thereof are provided along an identical face on the other side of the housing.

(3) In the preferred embodiment, the connecting members are short; they could however be much larger depending on the configuration of the connector assembly.

What is claimed is:

1. An insert-moulded electrical connector having a housing including a sidewall with an outer surface and at least two rows of spaced terminals moulded and partially encapsulated in the housing, each terminal having a coupling member projecting from the housing in one of the rows and a contact member, the coupling members being adapted to couple to a mating terminal, and the contact members being interspersed with each other and arranged in a single plane extending along the outer surface of the housing so as to be exposed for electrical connection to a circuit board.

2. A connector according to claim 1 and further including a position fixing member for said terminals, said position fixing member having a plurality of apertures, and each of said terminals passing through a respective one of said apertures.

3. A connector according to claim 1 wherein said rows of terminals are in mutually parallel planes.

4. A connector according to claim 3 wherein one of said rows of spaced terminals is in said single plane.

5. A connector according to claim 1 wherein each row of terminals is respectively connected by a common carrier.

6. A connector according to claim 5 wherein said contact members are connected to said common carriers by respective connecting members, the connecting members lying in a common plane.

7. An insert-moulded electrical connector having a fixing member with apertures formed therein, a plurality of terminals, each terminal having a coupling member adapted to couple to a mating terminal and a contact member to connect to a circuit board, the terminals projecting through the apertures in the fixing member to define at least two rows of the coupling members, and a housing moulded about the fixing member and a substantial portion of the terminals including at least a portion of the contact members to form an integral unit.

8. An connector in accordance with claim 7 wherein the contact member interspersed with each other and arranged in a single plane along an outer surface housing so as to be exposed for electrical connection to a circuit board.

9. A method of manufacturing an insert-moulded electrical connector comprising forming at least two sets of terminals, each set of terminals having a carrier interconnecting the terminals of each set, and each terminal including a coupling member adapted to couple to a mating terminal and a contact member to connect to a circuit board, placing each set of terminals in a fixing member to hold the terminals in a predetermined position, moulding a plastic housing about the fixing member and a substantial portion of each terminal including at least a portion of the contact portion to form an integral unit, and removing the carrier from each set of terminals.

10. A method in accordance with claim 9 wherein each carrier includes holes which are placed over pins to position the terminals in a mould prior to moulding the plastic housing.

11. A method in accordance with claim 9 wherein the contact members for all of the terminals are placed in a single plane.

12. A method in accordance with claim 11 wherein the plastic housing is moulded about the terminals such that the contact members extend along an outer surface of the housing to be exposed for connection to a circuit board.

* * * * *